United States Patent Office 3,482,975
Patented Dec. 9, 1969

3,482,975
PHOTOETCHING OF GOLD

Donald L. Schaefer, Schenectady, N.Y., assignor to General Electric Company, a corporation of New York No Drawing. Filed Dec. 27, 1966, Ser. No. 604,601
Int. Cl. G03f *7/10;* G03c *5/00*
U.S. Cl. 96—36 3 Claims

ABSTRACT OF THE DISCLOSURE

A process is disclosed whereby gold surfaces and particularly thin supported gold films may be selectively etched by exposing an interface between the gold surface and a liquid solution of a material which is photodecomposable to form chemically reactive species which react with gold to form soluble gold products to activating radiation.

This invention relates to the etching of metallic gold in response to the impingement of activating radiation on the surface thereof and, more particularly to the provision of a method for the etching of metallic gold in a liquid solution containing photodecomposable substances which when exposed to activating radiation decompose to form chemically reactive species which react with and etch the gold at the gold-liquid interface in the illuminated zones. It should be noted at this point that the photoetching of gold was previously unsuccessfully attempted by the process disclosed in copending application Ser. No. 275,753, Gaynor, filed Apr. 25, 1963, now Patent No. 3,346,384, granted Oct. 10, 1967, entitled "Metal Image Formation" and assigned to the assignee of the present invention.

BACKGROUND OF THE INVENTION

The use of gold films for the electrically conductive paths in so-called printed circuit elements, particularly for use in miniaturized circuits is known. Gold is a particularly useful material because of its chemical stability, its high electrical conductivity, and the technology of the deposition of thin films of gold on various substrates by evaporation, electroplating or combinations of these techniques is well developed. However, in the prior art techniques, after a suitable substrate had been provided with a thin gold film, production of a circuit pattern therefrom required the use of a photoresist-etching technique to remove the unwanted areas of gold, leaving the desired pattern of conducting paths comprising the circuit. For example, this technique conventionally involves coating a film of gold uniformly over the surface of a suitable nonconductive substrate such as glass or an organic polymeric material, for example, by evaporation in a vacuum chamber. The film is overcoated with a conventional photoresist material which is then exposed to a pattern of activating radiation in the form of the circuit pattern to be produced. The photoresist material reacts to the radiation such that those areas or zones which were irradiated are converted to an insoluble material while those zones which were not illuminated remain soluble. The photoresist material is then washed in a solvent which removes the soluble portions of the photoresist film leaving behind the pattern of insoluble photoresist coating in the form of a mask over the gold film. The exposed portions of the gold film may then be removed by etching with a solvent for gold such as potassium cyanide or aqua regia, for example. Thereafter, the photoresist mask may be removed in part or entirely and the printed circuit element further processed. It will therefore be seen that this procedure has several inherent disadvantages. The photolytic reaction of the photoresist materials usually involves a polymerization or cross-linking type reaction and the edge resolution between reacted and unreacted zones is frequently of uncertain quality and may be difficult to consistently reproduce from element to element. Considerable care must be exercised during the washing step to prevent portions of the insoluble photoresist pattern from lifting, yet all of the soluble material must be removed. Undercutting of the insoluble pattern by the etchant is unavoidable and virtually impossible to accurately control which introduces variations in the electrical characteristics of each element for which external compensation may be necessary. The etchants employed are extremely hazardous. The only way in which the conductivity or resistivity of a given current carrying path may be adjusted is by varying the width of the path since the thickness of the film is constant. Furthermore, great care must be exercised in removing the insoluble photoresist pattern to avoid damage to the gold film circuit. It would be advantageous to eliminate the necessity for the use of the photoresist material and the multiple step process attendant therewith and the use of these hazardous materials.

It is therefore a principal object of this invention to provide a process for etching predetermined patterns in gold surfaces which does not require the use of a mask or highly toxic or corrosive etchants.

A further object of this invention is the provision of a method for the selective etching of a gold surface at controllably different rates in different zones thereof simultaneously.

Other and specifically different objects of this invention will become apparent to those skilled in the art from the following disclosure.

SUMMARY OF THE INVENTION

Briefly stated, this invention provides a method for the selective etching of gold surfaces and particularly thin supported gold films by providing a common interface between the gold surface and a liquid solution of a photodecomposable material which is nominally inert with respect to gold, exposing said interface to a pattern of activating radiation whereby said material is photolytically decomposed to form species which are chemically reactive with gold to form soluble gold complexes or compounds whereupon a pattern is etched in the gold surface which has a point-to-point correspondence to the pattern of activating radiation and at a rate which is dependent at least in part upon the intensity of the radiation at any given point on the interface.

DESCRIPTION OF THE PREFERRED EMBODIMENTS

More particularly, the following specific working examples demonstrate the invention in greater detail.

EXAMPLE 1

A solution containing about 0.1 molar iodoform in benzene containing 20 percent by volume acetone was prepared. A molybdenum wire having about 3 to 4 microns of gold electroplated on its surface was placed in a quartz vial which was then filled with the solution. A portion of the surface of the gold plated wire was exposed to illumination from a 200 watt high pressure xenon lamp for about 50 minutes, at the end of which time the gold film in those areas exposed to the incident light was found to have been completely removed from the surface of the wire.

EXAMPLE 2

The preceding example was duplicated except that an aqueous solution of about 0.1 molar potassium ferrocyanide was substituted for the iodoform solution. Again, after about a 50 minute exposure, the gold film in those areas exposed to the incident light was found to have been completely removed from the surface of the wire.

From all the foregoing, it will be seen that gold surfaces may be photolytically etched in a controlled pattern. The particularly disclosed concentrations of the photolytically decomposable reagents are not believed to be critical nor the invention limited to the specific reagents disclosed. For example, other water soluble non-toxic complex cyanides such as, for example, sodium ferrocyanide may be employed and other photodecomposable halogenated organic compounds may be used. Furthermore, by employing patterns of activating radiation by projection through a photographic transparency having zones of varying opacity, etching rates in such zones may be regulated since the etching rate is dependent upon the level of illumination.

From the foregoing, it will be apparent to those skilled in the art that variations of the specific etching techniques may be readily accomplished within the scope of the invention. Therefore the invention should not be limited except as defined by the following claims.

What I claim as new and desire to secure by Letters Patent of the United States is:

1. The method of photoetching gold comprising the steps of subjecting a metallic gold surface to a liquid solution selected from the group consisting of a solution of iodoform in acetone and benzene and an aqueous solution of a water soluble ferrocyanide, a constituent of said solution being photodecomposable to form chemically reactive species which combine with gold to form gold products which are soluble in the liquid solution, and exposing the liquid covered gold surface to activating radiation to form said soluble gold products in zones of the interface which are irradiated.

2. The method recited in claim 1 wherein said liquid solution is an aqueous solution of potassium ferrocyanide.

3. The method recited in claim 1 wherein said metallic gold surface comprises the outer surface of a supported thin film and the exposure to activating radiation is continued for a time sufficient to remove the thin film in illuminated zones of the interface.

References Cited

UNITED STATES PATENTS 3,346,384 10/1967 Gaynor ------------- 96—36.2

GEORGE F. LESMES, Primary Examiner

J. F. BRAMMER, Assistant Examiner

U.S. Cl. X.R.

96—36.2